(12) United States Patent
Oh

(10) Patent No.: US 9,252,395 B2
(45) Date of Patent: Feb. 2, 2016

(54) ORGANIC LIGHT-EMITTING DEVICE (OLED) DISPLAY AND METHOD OF MANUFACTURING THE SAME

(71) Applicant: Samsung Display Co., Ltd., Yongin, Gyeonggi-Do (KR)

(72) Inventor: Young-Eun Oh, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/490,487

(22) Filed: Sep. 18, 2014

(65) Prior Publication Data

US 2015/0340652 A1    Nov. 26, 2015

(30) Foreign Application Priority Data

May 23, 2014  (KR) .......................... 10-2014-0062591

(51) Int. Cl.
*H01L 51/52* (2006.01)
*H01L 51/56* (2006.01)
*H01L 27/32* (2006.01)
*H01L 51/00* (2006.01)

(52) U.S. Cl.
CPC ........ *H01L 51/5256* (2013.01); *H01L 27/3244* (2013.01); *H01L 51/56* (2013.01); *H01L 51/0034* (2013.01); *H01L 51/0035* (2013.01); *H01L 2227/323* (2013.01); *H01L 2251/5338* (2013.01)

(58) Field of Classification Search
CPC . H01L 51/56; H01L 51/5253; H01L 27/3244; H01L 51/5237

USPC ........................................................ 313/512
See application file for complete search history.

(56) References Cited

U.S. PATENT DOCUMENTS

| | | | |
|---|---|---|---|
| 6,706,544 B2* | 3/2004 | Yamazaki et al. | 438/30 |
| 8,710,739 B2* | 4/2014 | Tsai et al. | 313/512 |
| 2003/0218422 A1* | 11/2003 | Park et al. | 313/512 |
| 2005/0023974 A1* | 2/2005 | Chwang et al. | 313/512 |
| 2008/0296600 A1 | 12/2008 | Kwack et al. | |
| 2010/0007270 A1* | 1/2010 | Suh | 313/504 |
| 2013/0228754 A1 | 9/2013 | Park | |
| 2013/0237116 A1* | 9/2013 | Lee | 445/25 |
| 2014/0028686 A1 | 1/2014 | He et al. | |

FOREIGN PATENT DOCUMENTS

| | | |
|---|---|---|
| KR | 10-2008-0105308 A | 12/2008 |
| KR | 10-2012-0046427 A | 5/2012 |
| KR | 10-2013-0101397 A | 9/2013 |

* cited by examiner

*Primary Examiner* — Donald Raleigh
(74) *Attorney, Agent, or Firm* — Knobbe, Martens, Olson & Bear, LLP

(57) ABSTRACT

An organic light-emitting device (OLED) display is disclosed. In one aspect, the display includes a substrate, a plurality of first electrodes separated from each other over the substrate and a second electrode facing and formed across the first electrodes. The display also includes an intermediate layer interposed between the first electrodes and the second electrode, wherein the intermediate layer comprises an emission layer. The display further includes a plurality of encapsulation layer portions patterned to be separated from each other in an island form over the second electrode.

18 Claims, 5 Drawing Sheets

ORGANIC LIGHT-EMITTING DEVICE (OLED) DISPLAY AND METHOD OF MANUFACTURING THE SAME

INCORPORATION BY REFERENCE TO ANY PRIORITY APPLICATIONS

This application claims the benefit of Korean Patent Application No. 10-2014-0062591, filed on May 23, 2014, in the Korean Intellectual Property Office, the disclosure of which is incorporated herein in its entirety by reference.

BACKGROUND

1. Field

The described technology generally relates to an organic light-emitting device (OLED) display and a method of manufacturing the same.

2. Description of the Related Technology

Recently, OLED display devices have been used in various applications and their scope of use has grown wider due to reduced thickness and weight. In particular, as demand for wearable devices rapidly increases, the development of a flexible OLED display actively proceeds.

A flexible display is formed to be bent or curved to increase user convenience, and thus, features of a substrate and thin films, which are included in the flexible display, need to be controlled to ensure flexibility.

SUMMARY OF CERTAIN INVENTIVE ASPECTS

One inventive aspect is an OLED display having improved durability and user convenience and a method of manufacturing the same.

Another aspect is an OLED display with improved durability and user convenience and a method of manufacturing the same in order to solve diverse problems including the aforementioned problem.

Another aspect is an OLED display which includes: a substrate; a plurality of first electrodes that are arranged to be separated from each other on the substrate; a second electrode that is arranged across the plurality of first electrodes to face the plurality of first electrodes; an intermediate layer that is arranged between the plurality of first electrodes and the second electrode and comprises an emission layer; and encapsulation layers that are patterned to be separated from each other in an island form on the second electrode.

The substrate may be a flexible substrate.

Each of the encapsulation layers may include one or more inorganic layers.

Each of the encapsulation layers may include an inorganic layer and an organic layer that are alternately stacked.

The OLED display may further include an organic encapsulation layer that covers the encapsulation layers.

The organic encapsulation layer may be formed of one or more materials selected from the group consisting of polyethyleneterephthalate, polyethylenenaphthalate, polycarbonate, polyimide, polyethylenesulfonate, polyoxymethylene, and polyarylate.

The encapsulation layers may correspond to the plurality of first electrodes.

Another aspect is a method of manufacturing an OLED display, the method including: forming a plurality of first electrodes that are arranged to be separated from each other on a substrate; forming an intermediate layer having an emission layer on the plurality of first electrodes; forming a second electrode on the intermediate layer to face the plurality of first electrodes; and forming encapsulation layers that are patterned to be separated from each other in an island form on the second electrode.

The forming of the encapsulation layers may include forming encapsulation layers respectively including one or more inorganic layers.

The forming of the encapsulation layers may include forming encapsulation layers including an inorganic layer and an organic layer that are alternately stacked.

The method may further include forming an organic encapsulation layer that covers the encapsulation layers. The Ruining of the encapsulation layers may include forming encapsulation layers to correspond to the plurality of first electrodes.

Another aspect is an organic light-emitting device (OLED) display comprising: a substrate; a plurality of first electrodes separated from each other over the substrate; a second electrode facing and formed across the first electrodes; an intermediate layer interposed between the first electrodes and the second electrode, wherein the intermediate layer comprises an emission layer; and a plurality of encapsulation layer portions patterned to be separated from each other in an island form over the second electrode.

In the above display, the substrate comprises a flexible substrate. In the above display, each of the encapsulation layer portions comprises one or more inorganic layers. In the above display, each of the encapsulation layer portions comprises an inorganic layer and an organic layer that are alternately stacked. In the above display, the inorganic layer is thicker than the organic layer. In the above display, the encapsulation layer portions comprise an innermost layer that contacts the second electrode, and wherein the inorganic layers comprise the inner most layer. The above display further comprises an organic encapsulation layer that covers the encapsulation layer portions.

In the above display, the organic encapsulation layer is formed of one or more materials selected from the group consisting of polyethyleneterephthalate, polyethylenenaphthalate, polycarbonate, polyimide, polyethylenesulfonate, polyoxymethylene, and polyarylate. In the above display, the encapsulation layer portions spatially correspond to the first electrodes. In the above display, each of the encapsulation layer portions corresponds to a thin film transistor electrically connected to the first electrodes. In the above display, the encapsulation layer portions are respectively formed directly above the thin film transistors.

Another aspect is a method of manufacturing an organic light-emitting device (OLED) display, the method comprising: forming a plurality of first electrodes to be separated from each other over a substrate; forming an intermediate layer including an emission layer over the first electrodes; forming a second electrode over the intermediate layer to face the first electrodes; and forming a plurality of encapsulation layer portions that are patterned to be separated from each other in an island form over the second electrode.

In the above method, each of the encapsulation layer portions respectively comprises one or more inorganic layers. In the above method, each of the encapsulation layer portions comprises an inorganic layer and an organic layer that are alternately stacked. The above method further comprises forming an organic encapsulation layer that covers the encapsulation layer portions. In the above method, the encapsulation layer portions spatially respectively correspond to the first electrodes.

Another aspect is an organic light-emitting device (OLED) display comprising: a substrate; a plurality of first electrodes separated from each other over the substrate; a second electrode facing and formed across the first electrodes; an intermediate layer interposed between the first electrodes and the second electrode, wherein the intermediate layer comprises an emission layer; and a plurality of encapsulation layer portions formed over the second electrode and separated from each other.

In the above display, each of the encapsulation layer portions comprises an inorganic layer and an organic layer that are alternately stacked. In the above display, the inorganic layer is thicker than the organic layer. In the above display, the encapsulation layer portions comprise an innermost layer that contacts the second electrode, and wherein the inorganic layers comprise the inner most layer.

DETAILED DESCRIPTION OF CERTAIN INVENTIVE EMBODIMENTS

Figure 1:
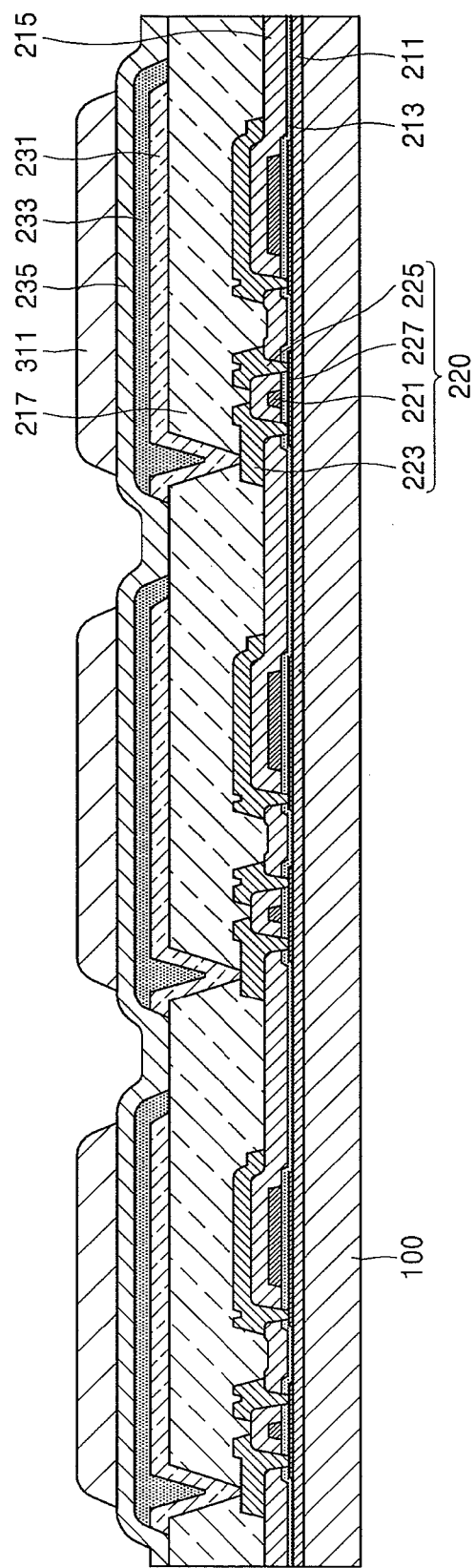
FIG. 1 is a schematic cross-sectional view of an OLED display according to an embodiment.

Since the standard display is not generally sufficiently flexible, lifetime rapidly reduces as the display is repeatedly flexed.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

Hereinafter, embodiments will be described in detail with reference to the attached drawings. Like reference numerals in the drawings denote like elements and repeated descriptions thereof will be omitted.

It will be understood that when a component, such as a layer, a film, a region, or a plate, is referred to as being "on" another component, the component can be directly on the other component or intervening components may be present thereon.

Sizes of components in the drawings may be exaggerated for convenience of explanation. In other words, since sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a schematic cross-sectional view of an OLED display according to an embodiment.

Referring to FIG. 1, the OLED display includes a substrate 100, thin film transistors (TFTs) 220, a buffer layer 211, a gate insulating layer 213, an interlayer insulating layer 215, a planarization layer 217, a first electrode 231, an intermediate layer 233, a second electrode 235, and first inorganic layers 311 that are encapsulation layers. Also, each of the TFTs 220 includes a gate electrode 221, a source electrode 223, a drain electrode 225, and a semiconductor layer 227.

The substrate 100 may be a flexible substrate formed of plastics. In a case where the substrate 100 is formed of plastics, since a plastic substrate can penetrate moisture or oxygen more easily than a glass substrate, an organic light-emitting layer that is venerable to moisture and oxygen is deteriorated, thereby decreasing a lifetime of an organic light-emitting device. Therefore, the buffer layer 211 which is formed of a single-layer structure or a multiple layers is arranged on the substrate 100, wherein the single layer or multiple layers are formed of a silicon oxide, a silicon nitride or the like.

The TFTs 220 and a light-emitting device may be arranged on the buffer layer 211. The light-emitting device may include the first electrode 231, the intermediate layer 233, and the second electrode 235.

Each of the TFTs 220 includes the gate electrode 221, the source electrode 223, the drain electrode 225, the semiconductor layer 227, the gate insulating layer 213, and the interlayer insulating layer 215. As shown in FIG. 1, the TFT 220 may have a structure in which the semiconductor layer 227 is arranged at a lowest position, the gate electrode 221 is arranged on the semiconductor layer 227, and the source and drain electrodes 223 and 225 are arranged at an uppermost position. Alternatively, the TFT 220 may have a different structure. The semiconductor layer 227 may include a polysilicon layer, an amorphous silicon layer, an organic semiconductor layer or a conductive oxide semiconductor layer.

The gate electrode 221 is arranged to face the semiconductor layer 227 and electrical signals may be transmitted between the source electrode 223 and the drain electrode 225 according to signals transmitted to the gate electrode 221. In this regard, the gate insulating layer 213 formed of a silicon oxide, a silicon nitride, or the like is arranged between the semiconductor layer 227 and the gate electrode 221.

The interlayer insulating layer 215 is arranged on the gate electrode 221 and may be formed of a single layer or multiple layers, wherein the single layer or multiple layers can be formed of silicon oxide, a silicon nitride, etc. Materials forming the interlayer insulating layer 215 are not limited thereto and the interlayer insulating layer 215 may be variously changed. Materials forming other components are not limited to materials described herein and the components may also be embodied in different forms. The source electrode 223 and the drain electrode 225 are arranged on the interlayer insulating layer 215. The source electrode 223 and the drain electrode 225 are electrically connected to the semiconductor layer 227 via a contact hole formed in the interlayer insulating layer 215 and the gate insulating layer 213.

The planarization layer 217 (or a protection layer) is arranged on the source electrode 223 and the drain electrode 225 and protects or flattens the TFT 220 at the bottom thereof. The planarization layer 217 may be formed in many different forms. The planarization layer 217 may be formed of organic materials such as benzocyclobutene, and acryl or inorganic materials such as a silicon oxide, and a silicon nitride or may be formed of a single layer or multiple layers.

An organic light-emitting device (OLED) may be arranged on the planarization layer 217. The OLED includes the first electrode 231 that is a pixel electrode, the second electrode 235 that is an opposite electrode facing the pixel electrodes, and the intermediate layer 233 including at least an emission layer arranged between the first and second electrodes 231 and 235.

The first electrode 231 that is a pixel electrode may function as an anode electrode, and the second electrode 235 that is an opposite electrode may function as a cathode electrode, or vice versa.

The first electrode 231 may be a transparent electrode or a reflective electrode. When the first electrode 231 is a transparent electrode, the first electrode 231 may be formed of indium tin oxide (ITO), indium zinc oxide (IZO), zinc oxide (ZnO), or indium oxide ($In_2O_3$), and when the first electrode 231 is a reflective electrode, the first electrode 231 may include a reflective film formed of silver (Ag), magnesium (Mg), aluminum (Al), platinum (Pt), palladium (Pd), aurum (Au), nickel (Ni), iridium (Ir), chromium (Cr), or a compound thereof and a film that is formed of ITO, IZO, ZnO or $In_2O_3$ and arranged on the reflective film.

The second electrode 235 may be a transparent electrode or a reflective electrode. When the second electrode 235 is a transparent electrode, the second electrode 235 may include a film deposited to face the intermediate layer 233, which is arranged between the first electrode 231 that is the pixel electrode and the second electrode 235 that is the opposite electrode, and formed of lithium (Li), calcium (Ca), lithium fluoride/calcium (LiF/Ca), Al, Mg, or a compound thereof and may also include an auxiliary electrode or a bus electrode line formed of materials forming the transparent electrode, for example, ITO, IZO, ZnO, $In_2O_3$, or the like and arranged on the above-described film. When the second electrode 235 is a reflective electrode, the second electrode 235 may include a layer in which Li, Ca, LiF/Ca, Al, Mg, or a compound thereof is deposited.

The intermediate layer 233 including at least the emission layer is arranged between the first electrode 231 and the second electrode 235. The intermediate layer 233 may be formed of a low molecular weight organic material or a polymer organic material.

When the intermediate layer 233 is formed of a low molecular weight organic material, the intermediate layer 233 may have a structure in which a hole injection layer (HIL), a hole transport layer (HTL), an emission layer (EML), an electron transport layer (ETL), en electron injection layer (EIL), etc. are stacked. In this case, the intermediate layer 233 may include organic materials such as copper phthalocyanine (CuPc), N,N'-Di(naphthalene-1-yl)-N,N'-diphenyl-benzidine (NPB), and tris-8-hydroxyquinoline aluminum ($Alq_3$). Layers formed of low molecular weight organic materials may be formed by vacuum deposition or the like.

The intermediate layer 233, which is formed of a polymer organic material, may have a structure in which an HTL and an EML are stacked, and in this case, the intermediate layer 233 uses poly(3,4-ethylenedioxythiophene) (PEDOT) as an HTL and may use polymer organic materials, for example, a poly-phenylenevinylene-based material, a polyfluorene-based material, etc., as an emission layer.

The intermediate layer 233 including the emission layer may emit red, green, or blue light. One sub-pixel may be an area where any one of the red, green, and blue light is emitted, and a group including three sub-pixels may be a pixel. The sub-pixel may emit another color of light except for the red, green, and blue light. That is, if a pixel emits white light, sub-pixels having various colors may form a pixel. Alternatively, all sub-pixels emit white light and the white light may pass a color converting layer or a color filter.

The first inorganic layers 311 are arranged as a thin-film encapsulation layer that encapsulates the OLED. In particular, the first inorganic layers 311 are arranged on the second electrode 235 and are separated from each other in an island form.

In the OLED display, the thin-film encapsulation layer (or portion) may be formed of inorganic layers having a multi-layer structure or may have a structure in which organic layers and inorganic layers are alternately stacked. The thin-film encapsulation layer may be formed by depositing materials on an entire surface of a panel. When the panel is curved or bent in a state where the thin-film encapsulation layer is formed, some areas of a flexible display panel where the stress is intensified frequently have cracks even though the flexible display panel is thin enough. In addition, when the cracks are extended, the durability of the flexible display panel may be seriously damaged.

However, in the OLED display according to some embodiments, the first inorganic layers 311 that are thin-film encapsulation layers are arranged on the second electrode 235 and are separated from each other to face each pixel in an island form. The thin-film encapsulation layers that are patterned to be separated from each other in the island form may minimize the formation of cracks even though the thin-film encapsulation layers are curved or bent in any direction and under a certain intensity. Although some of the first inorganic layers 311 have cracks, the cracks are not extended to the other inorganic layers 311 because the inorganic layers 311 are patterned to be separated each other. Therefore, in the OLED display according to the present embodiment, defects that may be generated during manufacture may be easily prevented, and thin-film encapsulation that is strong to bending may be implemented, thereby being used as a flexible display apparatus. In addition, the OLED display according to the present embodiment may have features of a flexible display apparatus.

In particular, as shown in FIG. 1, the first inorganic layers 311 that are thin-film encapsulation layers may correspond to a plurality of first electrodes 231, and thus, it is possible to strengthen the flexible characteristics of the OLED display and to implement strong encapsulation layers. The first electrodes 231 that are the pixel electrodes are patterned according to sub-pixel units. Therefore, the flexible characteristics of the OLED display may be maximized by patterning the first inorganic layers 311 that have a low flexibility according to sub-pixel units, that is, by patterning the first inorganic layers 311 to correspond to the first electrodes 231. Since the first inorganic layers 311 are patterned, cracks may not be generated on the first inorganic layers 311 or a generation possibility of the cracks may be greatly reduced even though the OLED display is bent. Embodiments and modified embodiments to be described later are the same as the present embodiment.

Figure 2:
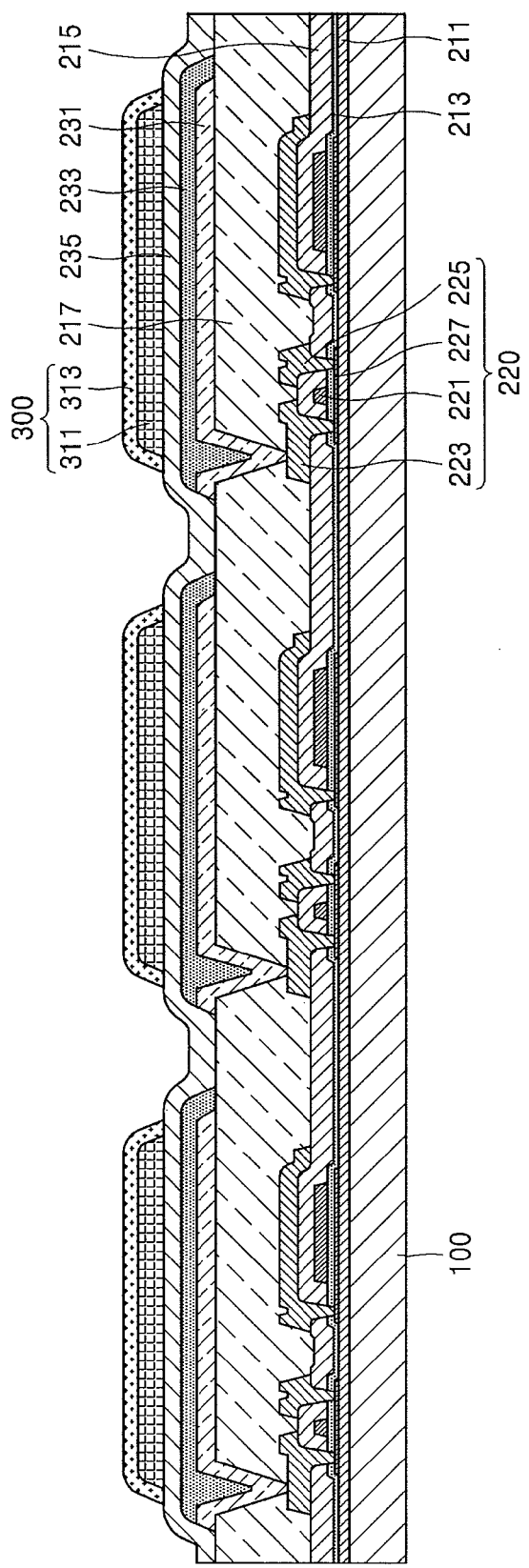
FIG. 2 is a schematic cross-sectional view of an OLED display according to another embodiment.

FIG. 2 is a schematic cross-sectional view of an OLED display according to another embodiment. In the OLED display according to the present embodiment, each thin-film encapsulation layer 300 has a structure in which a first inorganic layer 311, which are patterned to be separated from each other in an island form to correspond to each sub-pixel, and a second inorganic layer 313 are alternately stacked on a second electrode 235. Although cracks are generated in the first inorganic layers 311, the cracks may not be extended because the second inorganic layers 313 cover the first inorganic layers 311.

Figure 3:
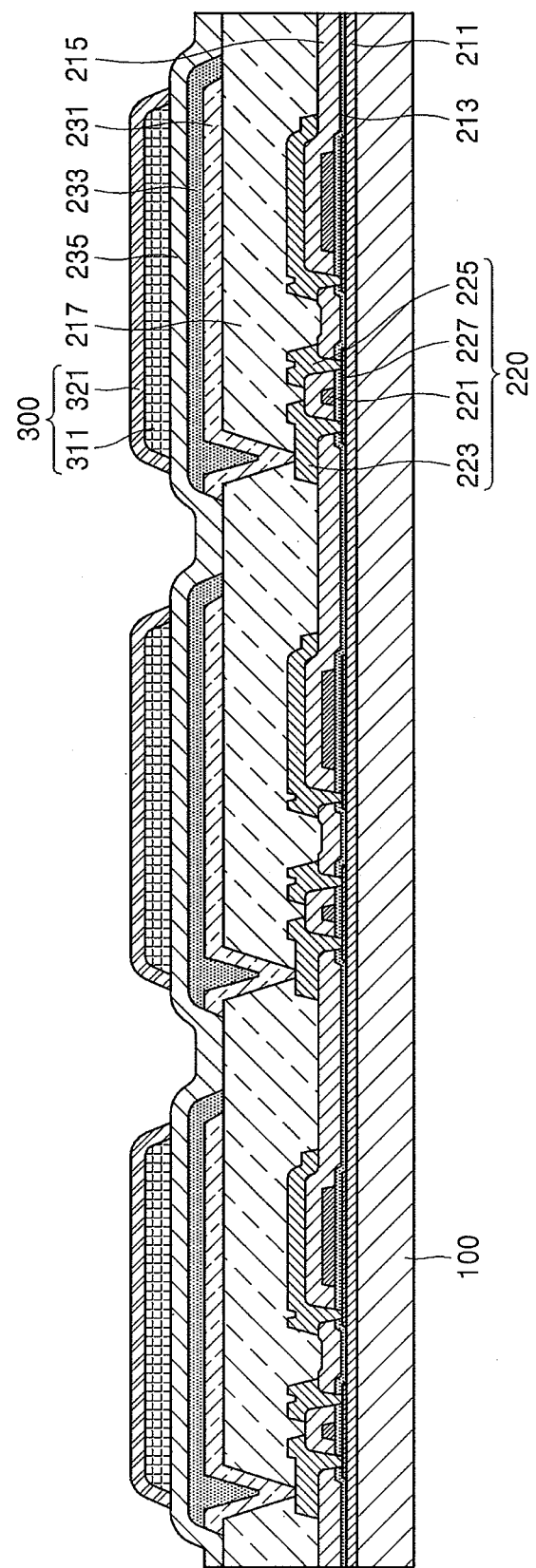
FIG. 3 is a schematic cross-sectional view of an OLED display according to still another embodiment.

FIG. 3 is a schematic cross-sectional view of an OLED display according to still another embodiment. A thin-film encapsulation layer 300 may have a structure in which a first inorganic layer 311, which are patterned to be separated from each other in an island form to correspond to each sub-pixel, and organic layers 321 are stacked on the first inorganic layer 311. Although cracks are generated in the first inorganic layers 311, the cracks may not be extended because the organic layers 321 cover the first inorganic layers 311. Other inorganic layers and other organic layers may be stacked on the organic layers 321 so that the OLED display may have an encapsulation structure in which inorganic layers and organic layers are stacked alternately.

Figure 4:
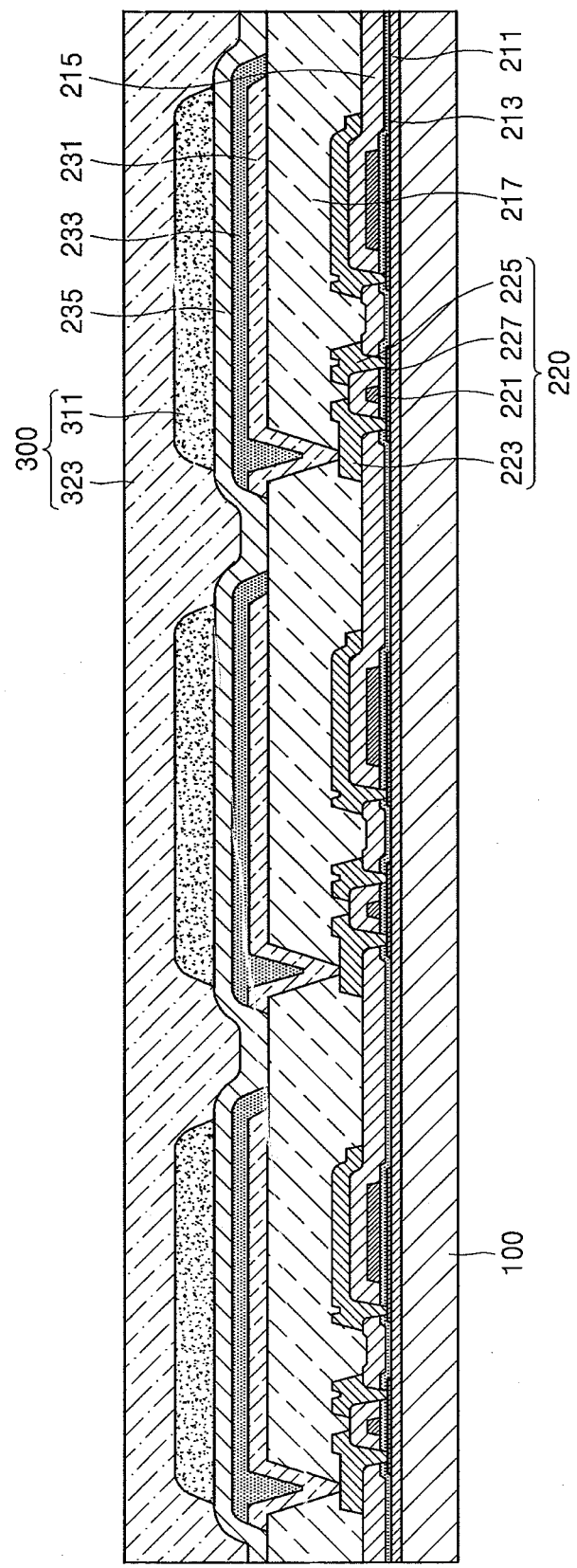
FIG. 4 is a schematic cross-sectional view of an OLED display according to still another embodiment.

FIG. 4 is a schematic cross-sectional view of an OLED display according to another embodiment. A thin-film encapsulation layer 300 of the OLED display may include first inorganic layers 311, which are patterned to be separated from each other in an island form to correspond to sub-pixels on a second electrode 235, and an organic encapsulation layer 323 formed across the first inorganic layers 311.

The organic encapsulation layer 323 may be formed of one or more materials selected from the group consisting of polyethyleneterephthalate, polyethylenenaphthalate, polycarbonate, polyimide, polyethylenesulfonate, polyoxymethylene, and polyarylate.

For example, in the OLED display described with reference to FIG. 3, organic materials, which are used to form the organic layers 321, need to be dotted on areas that are separated from each other and need to be controlled not to contact each other in order to form the organic layers 321 that are patterned. Therefore, the organic materials used to form the organic layers 321 need to be dotted on the areas that are separated from each other and surface treatment for the organic layers 321 needs to be performed. However, the above-described process makes a manufacturing procedure complicated, and accordingly, manufacturing yields are decreased and manufacturing costs are increased.

However, in the OLED display described with reference to FIG. 4, an organic encapsulation layer 323 is formed on an entire top surface of the first inorganic layers 311, and thus, the manufacturing procedure is simplified, thereby increasing manufacturing yields. In addition, cracks may not be generated on the first inorganic layers 311 due to a structure in which the first inorganic layers 311 that are patterned in the island form are covered with the organic encapsulation layer 323, and accordingly, the first inorganic layers 311 may have a strong structure.

Figure 5:
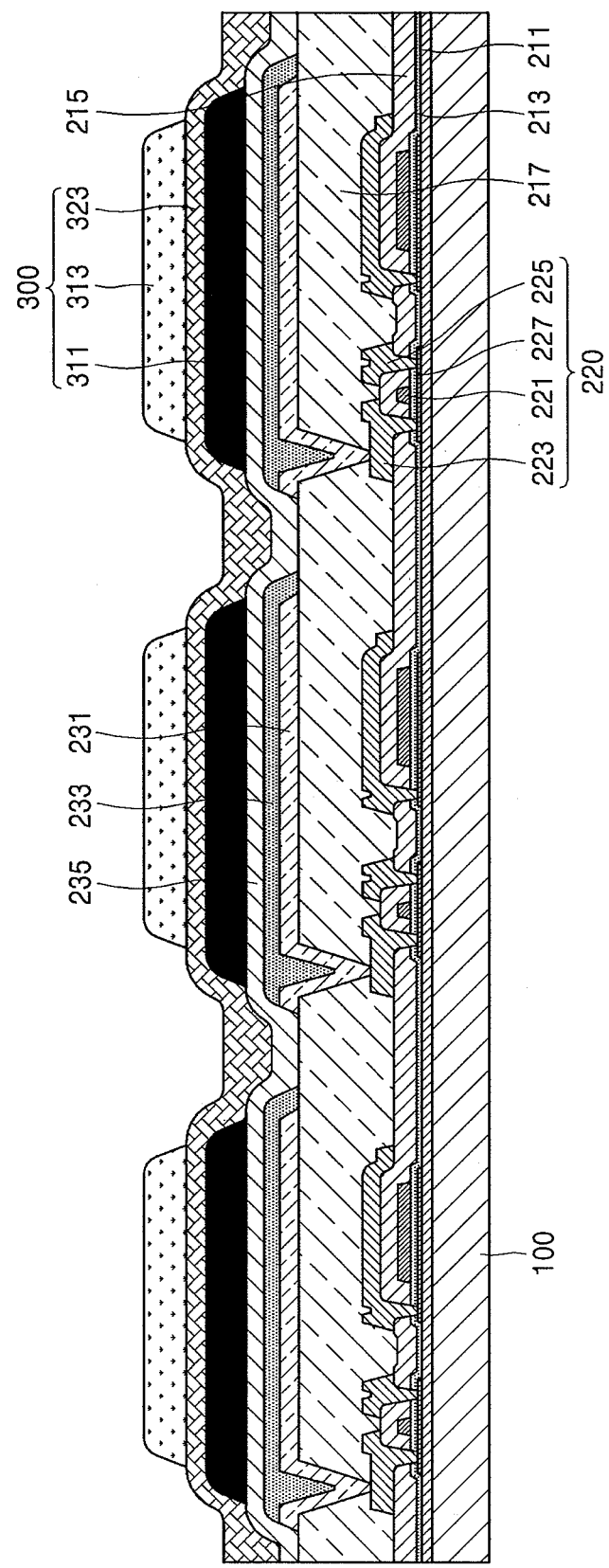
FIG. 5 is a schematic cross-sectional view of an OLED display according to still another embodiment.

FIG. 5 is a schematic cross-sectional view of an OLED display according to still another embodiment. The OLED display further includes second inorganic layers 313 that are patterned in the island form on the organic encapsulation layer 323. Although cracks are generated between the first inorganic layers 311 and the organic encapsulation layer 323 due to strong stress, the second inorganic layers 313 may cover the cracks.

A case where the first inorganic layers 311 are patterned to correspond to each pixel electrode is described so far, but the present invention is not limited thereto. For example, the first inorganic layers 311 are patterned, and thus, one island form may correspond to a plurality of (sub) pixels.

A method of manufacturing the OLED display will be described. The method of manufacturing the OLED display can include i) forming first electrodes 231 to be separately arranged on a substrate 100, ii) forming an intermediate layer 233, which includes an emission layer, on the first electrodes 231 and iii) forming a second electrode 235 on the intermediate layer 233 to face the first electrodes 231. Then, the OLED display having thin-film encapsulation layers 300, which are patterned to be separated from each other in an island form, may be manufactured by forming the thin-film encapsulation layers 300 that are patterned to be separated from each other in an island form. The OLED display having a structure that is strong to external stress such as bending may be manufactured.

According to one embodiment, as shown in FIG. 2, forming the thin-film encapsulation layers 300 may be forming a thin-film encapsulation layer 300 including one or more first inorganic layers 311.

Alternatively, forming the thin-film encapsulation layers 300 may be forming the thin-film encapsulation layers 300 including the first inorganic layers 311 and the organic layers 321 that are alternately stacked as shown in FIG. 3. Alternately, the method of manufacturing an OLED display may further include forming the organic layers that cover the thin-film encapsulation layers 300. Forming the thin-film encapsulation layers 300 may be forming the thin-film encapsulation layers 300 to correspond to the first electrodes 231.

Cracks on the first inorganic layers 311 may be easily prevented and the OLED display having a structure that is strong to external stress such as bending may be manufactured due to the method of manufacturing the OLED display.

As described above, according to at least one of the disclosed embodiments, an OLED display having improved durability and user convenience and a method of manufacturing the same may be implemented.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. An organic light-emitting device (OLED) display comprising:
   a substrate;
   a plurality of first electrodes separated from each other over the substrate;
   a single second electrode facing and formed across the plurality of first electrodes without discontinuity;
   an intermediate layer interposed between the first electrodes and the second electrode, wherein the intermediate layer comprises a plurality of emission layers respectively disposed over the first electrodes; and
   a plurality of encapsulation layer portions patterned to be separated from each other in an island form over the second electrode, wherein each of the encapsulation layer portions comprises an inorganic layer and an organic layer that is on the inorganic layer, the organic layer being in direct contact with a layer which is below the inorganic layer and is in direct contact with the inorganic layer.

2. The OLED display of claim 1, wherein the substrate comprises a flexible substrate.

3. The OLED display of claim 1, wherein each of the encapsulation layer portions comprises one or more inorganic layers.

4. The OLED display of claim 1, wherein the inorganic layer is thicker than the organic layer.

5. The OLED display of claim 1, wherein the encapsulation layer portions comprise an innermost layer that contacts the second electrode, and wherein the inorganic layers comprise the inner most layer.

6. The OLED display of claim 1, further comprising an organic encapsulation layer that covers the encapsulation layer portions.

7. The OLED display of claim 6, wherein the organic encapsulation layer is formed of one or more materials selected from the group consisting of polyethyleneterephthalate, polyethylenenaphthalate, polycarbonate, polyimide, polyethylenesulfonate, polyoxymethylene, and polyarylate.

8. The OLED display of claim 1, wherein the encapsulation layer portions spatially correspond to the first electrodes.

9. The OLED display of claim 1, wherein each of the encapsulation layer portions corresponds to a thin film transistor electrically connected to the first electrodes.

10. The OLED display of claim 9, wherein the encapsulation layer portions are respectively formed directly above the thin film transistors.

11. A method of manufacturing an organic light-emitting device (OLED) display, the method comprising:
 forming a plurality of first electrodes to be separated from each other over a substrate;
 forming an intermediate layer including a plurality of emission layers respectively disposed over the first electrodes;
 forming a single second electrode over the intermediate layer without discontinuity to face and to be across the plurality of first electrodes; and
 forming a plurality of encapsulation layer portions that are patterned to be separated from each other in an island form over the second electrode, wherein each of the encapsulation layer portions comprises an inorganic layer and an organic layer that is on the inorganic layer, the organic layer being in direct contact with a layer which is below the inorganic layer and is in direct contact with the inorganic layer.

12. The method of claim 11, wherein each of the encapsulation layer portions respectively comprises one or more inorganic layers.

13. The method of claim 11, further comprising forming an organic encapsulation layer that covers the encapsulation layer portions.

14. The method of claim 11, wherein the encapsulation layer portions spatially respectively correspond to the first electrodes.

15. An organic light-emitting device (OLED) display comprising:
 a substrate;
 a plurality of first electrodes separated from each other over the substrate;
 a single second electrode facing and formed across the plurality of first electrodes without discontinuity;
 an intermediate layer interposed between the first electrodes and the second electrode, wherein the intermediate layer comprises a plurality of emission layers respectively disposed over the first electrodes; and
 a plurality of encapsulation layer portions formed over the second electrode and separated from each other, wherein each of the encapsulation layer portions comprises an inorganic layer and an organic layer that is on the inorganic layer, the organic layer being in direct contact with a layer which is below the inorganic layer and is in direct contact with the inorganic layer.

16. The OLED display of claim 15, wherein the inorganic layer is thicker than the organic layer.

17. The OLED display of claim 15, wherein the encapsulation layer portions comprise an innermost layer that contacts the second electrode, and wherein the inorganic layers comprise the inner most layer.

18. The OLED display of claim 1, wherein the second electrode has first and second surfaces opposing each other, wherein the second surface faces the first electrodes, and wherein each of the encapsulation layer portions is formed only on the first surface of the second electrode.

* * * * *